(12) United States Patent
El Dirani et al.

(10) Patent No.: US 10,978,487 B2
(45) Date of Patent: Apr. 13, 2021

(54) INVERTING CIRCUIT

(71) Applicants: STMicroelectronics (Crolles 2) SAS, Crolles (FR); STMicroelectronics SA, Montrouge (FR)

(72) Inventors: Hassan El Dirani, Grenoble (FR); Pascal Fonteneau, Theys (FR)

(73) Assignees: STMICROELECTRONICS (CROLLES 2) SAS, Crolles (FR); STMICROELECTRONICS SA, Montrouge (FR)

( * ) Notice: Subject to any disclaimer, the term of this patent is extended or adjusted under 35 U.S.C. 154(b) by 142 days.

(21) Appl. No.: 16/288,737

(22) Filed: Feb. 28, 2019

(65) Prior Publication Data

US 2019/0288005 A1 Sep. 19, 2019

(30) Foreign Application Priority Data

Mar. 13, 2018 (FR) ...................................... 1852165

(51) Int. Cl.
| | | |
|---|---|---|
| *H01L 29/76* | (2006.01) | |
| *H01L 27/12* | (2006.01) | |
| *H02M 7/5387* | (2007.01) | |
| *H01L 29/417* | (2006.01) | |
| *H03K 19/10* | (2006.01) | |
| *H03K 19/00* | (2006.01) | |
| *H03K 19/094* | (2006.01) | |

(52) U.S. Cl.
CPC .... *H01L 27/1203* (2013.01); *H01L 29/41716* (2013.01); *H02M 7/5387* (2013.01); *H03K 19/0013* (2013.01); *H03K 19/09421* (2013.01); *H03K 19/10* (2013.01)

(58) Field of Classification Search
None
See application file for complete search history.

(56) References Cited

U.S. PATENT DOCUMENTS

| | | | | |
|---|---|---|---|---|
| 7,180,135 | B1* | 2/2007 | Ioannou | H01L 27/1203 257/347 |
| 8,972,917 | B1* | 3/2015 | Lu | G06F 30/367 716/112 |
| 2008/0277733 | A1* | 11/2008 | Fukutome | H01L 21/823864 257/368 |
| 2014/0017821 | A1* | 1/2014 | Fenouillet-Beranger | H01L 27/0262 438/10 |
| 2018/0061838 | A1 | 3/2018 | El Dirani et al. | |

OTHER PUBLICATIONS

El Dirani, H., et al., "Novel FDSOI Band-Modulation Device: Z2-FET with Dual Ground Planes", 2016 46th European Solid-State Device Research Conference (ESSDERC), IEEE, Sep. 12, 2016, pp. 210-213.
Wan, Jing. et al., "A systematic study of the sharp-switching Z2-FET device: From mechanism to modeling and compact memory applications", Solid-State Electronics, vol. 90, Apr. 29, 2013, pp. 2-11.

* cited by examiner

*Primary Examiner* — Calvin Y Choi
(74) *Attorney, Agent, or Firm* — Slater Matsil, LLP

(57) ABSTRACT

An inverter includes a semiconductor substrate. A Z2-FET switch is disposed at a first surface of the semiconductor substrate and a further switch is disposed at the first surface of the semiconductor substrate. The further switch and the Z2-FET switch have current paths coupled between a first reference terminal and a second reference terminal.

26 Claims, 2 Drawing Sheets

INVERTING CIRCUIT

CROSS-REFERENCE TO RELATED APPLICATIONS

This application claims priority to French Patent Application No. 1852165, filed on Mar. 13, 2018, which application is hereby incorporated herein by reference.

TECHNICAL FIELD

The present disclosure generally concerns electronic circuits such as inverting circuits.

BACKGROUND

Inverting circuits, or inverters, are circuits enabling to invert a signal. Such circuits are assemblies comprising transistors.

SUMMARY

The present disclosure generally concerns electronic circuits and, more particularly, logic circuits. Particular embodiments apply to the forming of an inverter.

An embodiment provides an inverter comprising a $Z^2$-FET switch.

According to an embodiment, a first gate of the $Z^2$-FET switch is coupled to a first terminal of application of a first potential.

According to an embodiment, the $Z^2$-FET switch is of type N.

According to an embodiment, the $Z^2$-FET switch is of type P.

According to an embodiment, the inverter comprises at least two $Z^2$-FET switches.

According to an embodiment, a first switch is an N-type $Z^2$-FET switch and a second switch is a P-type $Z^2$-FET switch.

According to an embodiment, the first switch has its anode coupled to a second terminal of application of a second potential and its cathode coupled to a third terminal of application of a third potential, and the second switch has its anode coupled to the second terminal and its cathode coupled to a fourth terminal of application of a fourth potential.

According to an embodiment, the second potential is a power supply potential.

According to an embodiment, the fourth potential is a reference potential.

According to an embodiment, the reference potential is the ground.

According to an embodiment, each $Z^2$-FET switch comprises a second gate.

According to an embodiment, the second gate is positioned on a surface opposite to a surface having the first gate positioned thereon.

According to an embodiment, the second gate comprises an N-type doped portion and a P-type doped portion.

According to an embodiment, the P-type doped portion is coupled to a fifth terminal of application of a fifth positive potential and the N-type doped portion is coupled to a sixth terminal of application of a sixth negative potential.

According to an embodiment, each $Z^2$-FET switch comprises, on a substrate, an anode region, a cathode region, a P-type doped region separating the anode region from the cathode region, and an insulated gate region positioned on top of and in contact with a portion of the P-type doped region.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
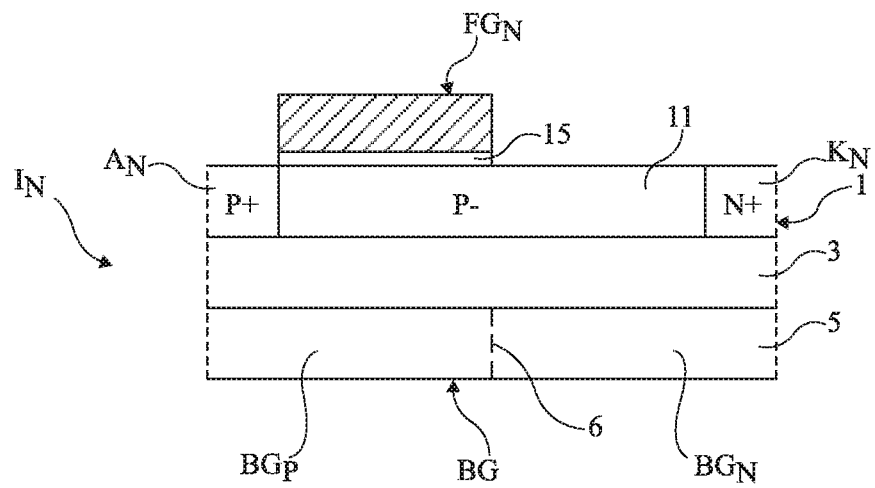
FIG. 1 is a simplified cross-section view illustrating an N-type $Z^2$-FET switch.

The same elements have been designated with the same reference numerals in the different drawings. For clarity, only those steps and elements which are useful to the understanding of the described embodiments have been shown and are detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the drawings. The terms "approximately", "substantially", and "in the order of" are used herein to designate a tolerance of plus or minus 10%, preferably of plus or minus 5%, of the value in question.

In the present description, the term "connected" will be used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

FIG. 1 is a cross-section view schematically showing a $Z^2$-FET switch, and more particularly an N-type switch $I_N$. In FIG. 1, switch $I_N$ is more particularly a double ground plane (DGP) $Z^2$-FET type switch.

Switch $I_N$ is formed inside and on top of a SOI ("Silicon On Insulator") structure comprising a semiconductor layer 1, currently made of silicon, resting on an insulating layer 3, currently called BOX (for "Buried OXide") and itself resting on a semiconductor support 5, currently made of silicon. Semiconductor support 5 is used as a back gate BG of switch $I_N$. An active area is delimited in layer 1 and comprises an anode region $A_N$ and a cathode region $K_N$ (or an anode $A_N$ and a cathode $K_N$) separated by an intermediate region 11. Anode region $A_N$ is heavily P-type doped (P+) and is located on the left-hand side of FIG. 1. Cathode region $K_N$ is heavily N-type doped (N+) and is located on the right-hand side of FIG. 1. Intermediate region 11 is heavily P type doped (P−) and is located between anode region $A_N$ and cathode region $K_N$. As an example, the intermediate region may be made of compressed silicon-germanium. Back gate BG is divided into a P-type doped portion $BG_P$ and an N-type doped portion $BG_N$. As a variation, the back gate might be P-type doped only. Portion $BG_P$ is positioned on the side of anode $A_N$ (on the left-hand side of FIG. 1) and portion $BG_N$ is positioned on the side of cathode $K_N$. Portions $BG_N$ and $BG_P$ are separated in FIG. 1 by dotted lines 6. An insulated gate is formed on a portion of layer 11 on the side of anode region 7. The insulated region comprises a gate region $FG_N$ called front gate $FG_N$ made of polysilicon and an insulating layer 15 resting on the portion of layer 11.

The operation of N-type $Z^2$-FET switch $I_N$ will now be described. During an operating phase, a potential is applied to back gate BG. More particularly, portion $BG_N$ is coupled to a terminal of application of a positive potential and portion $BG_P$ is coupled to a terminal of application of a negative potential. Further, a positive potential is applied to front gate $FG_N$. To turn on switch $I_N$, a positive potential is applied to anode $A_N$, after which a pulse at a zero potential is applied to front gate $FG_N$, which results in attracting electrons under front gate $FG_N$ of switch $I_N$. Switch $I_N$ thus is in a low-impedance state and is thus on.

Figure 2:
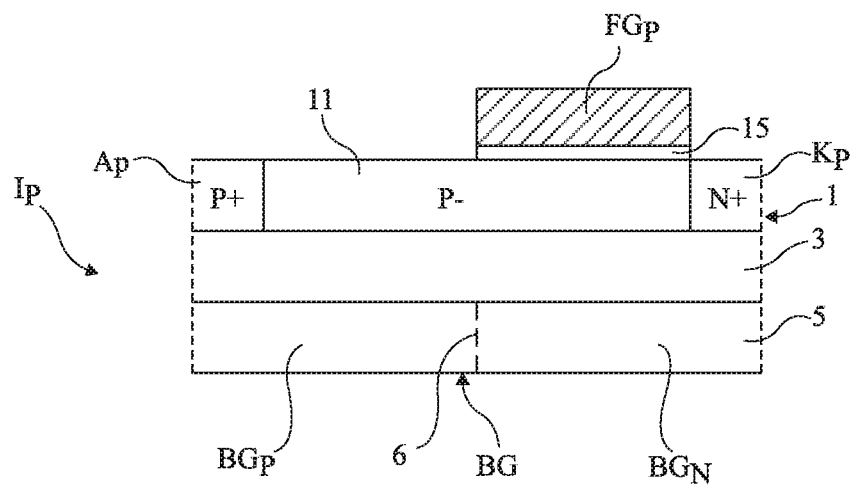
FIG. 2 is a simplified cross-section view illustrating a P-type $Z^2$-FET switch.

FIG. 2 is a cross-section view of a P-type $Z^2$-FET switch $I_P$. The switch $I_P$ of FIG. 2 is similar to the switch $I_N$ of FIG. 1, and thus switch $I_P$ comprises a semiconductor layer 1 resting on an insulating layer 3 which itself rests on a semiconductor layer 5. Layer 1 is divided into three regions: an anode region $A_P$, an intermediate region 11, and a cathode region $K_P$. The back gate and the front gate of switch $I_P$ are respectively designated with references BG and $FG_P$. The difference between switch $I_P$ and switch $I_N$ is that the insulated gate of switch $I_P$ is formed on a portion of layer 11 on the side of cathode region $K_P$ (on the right-hand side in FIG. 2). The insulated gate then still comprises front gate $FG_P$ and an insulating layer 15 resting on the portion of layer 11. The back gate is divided into two portions, one N-type doped ($BG_N$) and one P-type doped ($BG_P$).

The operation of P-type $Z^2$-FET switch $I_P$ will now be described. During an operating phase, back gate BG is coupled to a terminal of application of a potential. More particularly, portion $BG_P$ is coupled to a terminal of application of a positive potential and portion $BG_N$ is coupled to a terminal of application of a negative potential. Further, a zero potential is applied to front gate $FG_P$. To turn on switch $I_P$, a zero potential is applied to cathode $K_P$, after which a pulse at a positive potential is applied to front gate $FG_P$, which results in attracting holes under front gate $FG_P$ of switch $I_P$. Switch $I_P$ then is in a low-impedance state and is thus on.

Figure 3:
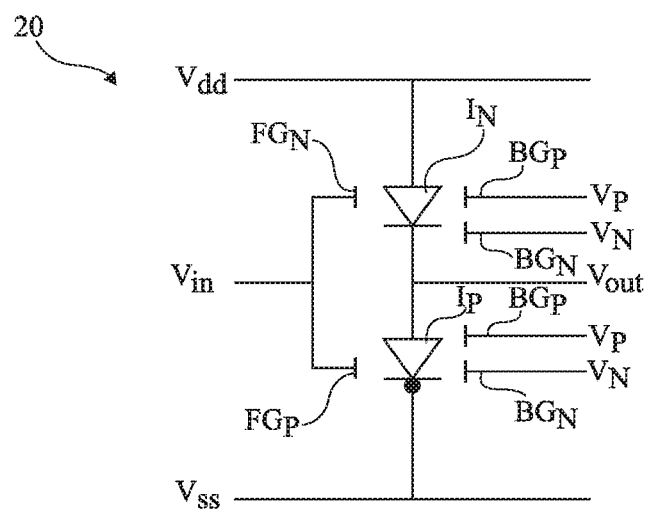
FIG. 3 is an electric diagram of an embodiment of an inverter.

FIG. 3 is an electric diagram of an embodiment of an inverter 20 comprising an N-type $Z^2$-FET switch $I_N$ and a P-type $Z^2$-FET switch $I_P$.

In FIG. 3, the N-type and P-type $Z^2$-FET switches are symbolized in the form of a diode to which certain connections have been added. The anode of the diode corresponds to the anode of the switch and its cathode corresponds to the cathode of the switch. This symbol comprises connections symbolizing front gate $FG_N$ and the two doped portions of back gate $BG_N$ and $BG_P$. The connection symbolizing front gate $FG_N$ is positioned on the lateral side (on the left-hand side in FIG. 3) of the diode symbol, on the anode side for the N-type $Z^2$-FET switch and on the cathode side for the P-type $Z^2$-FET switch. The connection symbolizing the N-type doped portion $BG_N$ of the back gate is positioned on the lateral side (on the right-hand side in FIG. 3) of the diode symbol on the anode side. The connection symbolizing the P-type doped portion $BG_P$ of the back gate is positioned on the lateral side (on the right-hand side in FIG. 3) of the diode symbol on the cathode side. Further, to help differentiate the N-type $Z^2$ FET switch from the P-type $Z^2$-FET switch, the symbol of the P type $Z^2$-FET switch comprises on the cathode side a black dot.

In inverter 20, switches $I_N$ and $I_P$ are series-connected between a terminal of application of a power supply potential Vdd and a terminal of application of a reference potential Vss, for example, the ground. More particularly, the anode of switch $I_N$ is coupled, preferably connected, to the terminal of application of potential Vdd and the cathode of switch $I_N$ is coupled, preferably connected, to an output terminal supplying an output potential Vout. The anode of switch $I_P$ is coupled, preferably connected, to the output terminal supplying output potential Vout and the cathode of switch $I_P$ is coupled, preferably connected, to the terminal of application of reference potential Vss. The front gates of switches $I_N$ and $I_P$ are coupled, preferably connected, to a terminal of application of an input potential $V_{in}$. The N-type doped portions of the back gates of switches $I_N$ and $I_P$ are coupled, for example, connected, to a terminal of application of a positive potential $V_N$. The P-type doped portions of the back gates of switches $I_N$ and $I_P$ are coupled, for example, connected, to a terminal of application of a negative potential $V_P$.

Since the cathode of switch $I_P$ receives the reference potential (Vss), generally zero, a positive pulse on input potential Vin turns on switch $I_P$. The output potential is then equal to potential Vss.

Since the anode of switch $I_N$ receives the positive potential (Vdd), a negative or zero pulse on input potential Vin turns on switch $I_N$. The output potential is then equal to potential Vdd.

Figure 4:
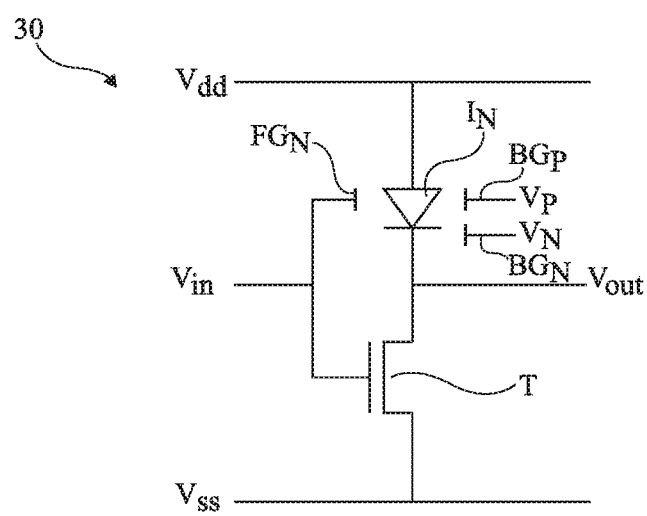
FIG. 4 is an electric diagram of another embodiment of an inverter.

FIG. 4 is an electric diagram of an embodiment of an inverter 30 comprising a $Z^2$-FET switch $I_N$ and of an N-channel MOS transistor T. Inverter 30 is similar to inverter 20, with the difference that switch $I_P$ is replaced with transistor T.

When input potential Vin is positive, transistor T turns on and the output potential is then equal to potential Vss.

Since the anode of switch $I_N$ receives a positive potential (Vdd), a negative or zero pulse on input potential Vin turns on switch $I_N$. The output potential is then equal to potential Vdd.

As a variation, based on the structure of FIG. 3, switch $I_N$ may be replaced with a P-channel MOS transistor.

As usual, the following terms are used:

lightly-doped semiconductor layer designates a layer having a dopant atom concentration in the range from $10^{14}$ to $5\times10^{15}$ atoms/cm$^3$;

heavily-doped semiconductor layer designates a layer having a dopant atom concentration in the range from $10^{17}$ to $10^{18}$ atoms/cm$^3$; and very heavily-doped semiconductor layer designates a layer having a dopant atom concentration in the range from $10^{18}$ to $10^{20}$ atoms/cm$^3$.

Specific embodiments have been described. Various alterations, modifications, and improvements will occur to those skilled in the art. In particular, N-type and P-type $Z^2$-FET switches having a fully lightly P-type doped back gate, also called single ground plane $Z^2$-FET switch, may be used.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inverter comprising:
a semiconductor substrate;
a $Z^2$-FET switch disposed at a first surface of the semiconductor substrate, wherein the $Z^2$-FET comprises a first anode, a first cathode, a first front gate, a first back gate, and a second back gate; and
a further switch disposed at the first surface of the semiconductor substrate, wherein the further switch comprises a second anode, a second cathode, a second front gate, a third back gate, and a fourth back gate, wherein the first back gate and the third back gate are coupled to a first reference potential and the second back gate and the fourth back gate are coupled to a second reference potential, the further switch having a current path between the anode and the cathode of the further switch coupled in series with a current path between the anode and the cathode of the $Z^2$-FET switch between a first reference terminal and a second reference terminal.

2. The inverter of claim 1, wherein the first gate is coupled to an inverter input terminal.

3. The inverter of claim 1, wherein the $Z^2$-FET switch is of type N.

4. The inverter of claim 1, wherein the $Z^2$-FET switch is of type P.

5. The inverter of claim 1, wherein the further switch comprises a second $Z^2$-FET switch.

6. The inverter of claim 5, wherein the $Z^2$-FET switch is an N-type $Z^2$-FET switch and wherein the further switch is a P-type $Z^2$-FET switch.

7. The inverter of claim 6, wherein the anode of the $Z^2$-FET switch is coupled to the first reference terminal and the cathode of the $Z^2$-FET switch is coupled to an inverter output terminal, and wherein the anode of the further switch is coupled to the inverter output terminal and the cathode of the further switch is coupled to the second reference terminal.

8. The inverter of claim 7, wherein the first reference terminal is a power supply terminal.

9. The inverter of claim 7, wherein the second reference terminal is a reference terminal.

10. The inverter of claim 9, wherein the reference terminal is ground.

11. The inverter of claim 1, wherein the first front gate and the second front gate are positioned on an upper surface of the semiconductor substrate and wherein the first back gate, the second back gate, the third back gate, and the fourth back gate are positioned on a lower surface of the semiconductor substrate, the lower surface opposite the upper surface.

12. The inverter of claim 1, wherein each second gate comprises an N-type doped portion and a P-type doped portion.

13. The inverter of claim 12, wherein, for the $Z^2$-FET switch and the further switch, the P-type doped portion is coupled to a positive potential and the N-type doped portion is coupled to a negative potential.

14. The inverter of claim 1, wherein the $Z^2$-FET switch comprises:
an anode region forming the anode disposed within the semiconductor substrate;
a cathode region forming the cathode disposed within the semiconductor substrate;
a P-type doped region separating the anode region from the cathode region; and
an insulated gate region positioned on top of and in contact with a portion of the P-type doped region.

15. An inverter comprising:
an N-type $Z^2$-FET switch having a cathode coupled to an inverter output terminal, an anode coupled to a positive reference terminal, a top gate coupled to an inverter input terminal, and a back gate having a P-type doped portion coupled to a positive potential and an N-type doped portion coupled to a negative potential; and
a P-type $Z^2$-FET switch having a cathode connected to the cathode of the N-type $Z^2$-FET switch and the inverter output terminal, an anode coupled to a negative reference terminal, a top gate coupled to the inverter input terminal, and a back gate having a P-type doped portion coupled to the positive potential and the N-type doped portion coupled to a negative potential.

16. An inverter comprising:
a silicon on insulator substrate having a semiconductor layer overlying an insulating layer that overlies a semiconductor substrate;
a first $Z^2$-FET switch having an anode region disposed in the semiconductor layer, a cathode region disposed in the semiconductor layer, a P-type doped region disposed in the semiconductor layer between the anode region and the cathode region, an insulated gate region positioned on top of and in contact with a portion of the P-type doped region, and a back gate disposed in the semiconductor substrate beneath the anode region, cathode and P-type doped region;
a second $Z^2$-FET switch having an anode region disposed in the semiconductor layer, a cathode region disposed in the semiconductor layer, a P-type doped region disposed in the semiconductor layer between the anode region and the cathode region, an insulated gate region positioned on top of and in contact with a portion of the P-type doped region, and a back gate disposed in the semiconductor substrate beneath the anode region, cathode and P-type doped region;
an input terminal coupled to the gate region of the first $Z^2$-FET switch and to the gate region of the second $Z^2$-FET switch;
an output terminal coupled to the cathode region of the first $Z^2$-FET switch and to the cathode region of the second $Z^2$-FET switch;
a first reference terminal coupled to the anode region of the first $Z^2$-FET switch; and
a second reference terminal coupled to the anode region of the second $Z^2$-FET switch.

17. The inverter of claim 16, wherein the back gate of the first $Z^2$-FET switch comprises a first N-type doped portion and a first P-type doped portion and wherein the back gate of the second $Z^2$-FET switch comprises a second N-type doped portion and a second P-type doped portion.

18. The inverter of claim 17, wherein the first and second P-type doped portions are coupled to a positive potential and wherein the first and second N-type doped portions are coupled to a negative potential.

19. The inverter of claim 16, wherein the first $Z^2$-FET switch is of type N and wherein the second $Z^2$-FET switch is of type P.

20. The inverter of claim 16, wherein the first reference terminal is a power supply terminal and the second reference terminal is a ground terminal.

21. The inverter of claim 15, wherein the N-type $Z^2$-FET switch comprises:
  a first anode region forming the anode of the N-type $Z^2$-FET switch disposed within a semiconductor layer of a silicon on insulator (SOI) substrate;
  a first cathode region forming the cathode of the N-type $Z^2$-FET switch disposed within the semiconductor layer;
  a first P-type doped region separating the anode region from the cathode region; and
  the P-type doped portion of the N-type $Z^2$-FET switch and the N-type doped portion of the N-type $Z^2$-FET switch formed on a semiconductor substrate portion of the SOI substrate.

22. The inverter of claim 21, wherein the top gate of the N-type $Z^2$-FET switch directly overlies the P-type doped portion of the back gate of the N-type $Z^2$-FET switch, and wherein the top gate is disposed over the P-type doped region and disposed closer to the anode region than the cathode region.

23. The inverter of claim 21, wherein the P-type $Z^2$-FET switch comprises:
  an anode region forming the anode of the P-type $Z^2$-FET switch disposed within the semiconductor layer;
  a cathode region forming the cathode of the P-type $Z^2$-FET switch disposed within the semiconductor layer;
  a P-type doped region separating the anode region from the cathode region; and
  the P-type doped portion and the N-type doped portion formed on a semiconductor substrate portion of the SOI substrate.

24. The inverter of claim 23, wherein the top gate of the P-type $Z^2$-FET switch directly overlies the N-type doped portion of the back gate of the P-type $Z^2$-FET switch, and wherein the top gate is disposed over the P-type doped region and disposed closer to the cathode region than the anode region.

25. An inverter comprising:
  an N-type $Z^2$-FET switch disposed at a first surface of a semiconductor substrate, wherein the $Z^2$-FET comprises a P-type anode region, an N-type cathode region, a P-type intermediate region disposed between the P-type anode region and the N-type cathode region, a front gate disposed over the P-type intermediate region, a first back gate comprising a P-type doped portion, and a second back gate comprising a N-type doped portion, the first back gate being coupled to a negative reference potential node and the second back gate being coupled to a positive reference potential node; and
  an N-channel MOS transistor disposed at the first surface of the semiconductor substrate, the N-channel MOS transistor having a gate, the N-channel MOS transistor being coupled between the N-type cathode region of the N-type $Z^2$-FET switch and a reference potential node, the P-type anode region coupled to a supply voltage node, the gate of the N-channel MOS transistor and the front gate of the N-type $Z^2$-FET switch being coupled to an input voltage node.

26. The inverter of claim 25, wherein the P-type intermediate region comprises silicon-germanium.

* * * * *